(12) United States Patent
Nishiwaki et al.

(10) Patent No.: US 7,657,997 B2
(45) Date of Patent: Feb. 9, 2010

(54) REFERENCE POSITION DETERMINING METHOD

(75) Inventors: Kentaro Nishiwaki, Osaka (JP); Yoichiro Ueda, Osaka (JP); Takayuki Fukae, Settsu (JP)

(73) Assignee: Panasonic Corporation, Osaka (JP)

( * ) Notice: Subject to any disclaimer, the term of this patent is extended or adjusted under 35 U.S.C. 154(b) by 529 days.

(21) Appl. No.: 11/201,134

(22) Filed: Aug. 11, 2005

(65) Prior Publication Data

US 2006/0048383 A1    Mar. 9, 2006

(30) Foreign Application Priority Data

Aug. 20, 2004   (JP) .............................. 2004-240467

(51) Int. Cl.
*H05K 3/00* (2006.01)
*H05K 3/32* (2006.01)
*H05K 13/00* (2006.01)
*H05K 13/04* (2006.01)

(52) U.S. Cl. .......................... 29/834; 29/833; 382/151; 702/150

(58) Field of Classification Search .................. 29/833, 29/834, 739, 740, 741; 382/151; 702/150, 702/152

See application file for complete search history.

(56) References Cited

U.S. PATENT DOCUMENTS

| | | | | |
|---|---|---|---|---|
| 5,992,013 A | * | 11/1999 | Morita | 29/833 |
| 6,591,219 B1 | * | 7/2003 | Iisaka | 702/152 |
| 7,349,575 B2 | * | 3/2008 | Hattori et al. | 382/184 |

FOREIGN PATENT DOCUMENTS

| | | |
|---|---|---|
| JP | 63-074530 | 4/1988 |
| JP | 11-154799 | 6/1999 |

* cited by examiner

*Primary Examiner*—A. Dexter Tugbang
*Assistant Examiner*—Livius R Cazan
(74) *Attorney, Agent, or Firm*—Wenderoth, Lind & Ponack, L.L.P.

(57) ABSTRACT

In a printing apparatus, individual positional data for positions of four object marks provided on a plurality of FPCs held on a conveyance tray are acquired by a mark position acquisition section based on an image acquired by an image acquisition unit. In a displaced mark specifying section, relative positional relations of four object marks are determined, and compared with a reference positional relation, by which a displaced object mark is specified. Then, in a reference position determining section, a reference position for a plurality of FPCs on a conveyance tray is determined based on a plurality of object marks resulting from excluding the displaced object mark out of the four object marks. Thus, a reference position in execution of printing in a printing unit can be determined with high precision.

3 Claims, 13 Drawing Sheets

*Fig. 14*

| L1 | L2 | L3 | L4 | L5 | L6 | EXCLUDED MARK |
|----|----|----|----|----|----|---------------|
| ×  | ×  | ○  | ○  | ×  | ○  | 91a           |
| ○  | ×  | ×  | ○  | ○  | ×  | 91b           |
| ○  | ○  | ×  | ×  | ×  | ○  | 91c           |
| ×  | ○  | ○  | ×  | ○  | ×  | 91d           |
| ×  | ×  | ×  | ○  | ×  | ×  | 91a, 91b      |
| ×  | ×  | ○  | ×  | ×  | ×  | 91a, 91d      |
| ×  | ○  | ×  | ×  | ×  | ×  | 91c, 91d      |
| ○  | ×  | ×  | ×  | ×  | ×  | 91b, 91c      |
| ⋮  | ⋮  | ⋮  | ⋮  | ⋮  | ⋮  | ⋮             |

REFERENCE POSITION DETERMINING METHOD

BACKGROUND OF THE INVENTION

The present invention relates to a technique for acquiring a reference position relative to a circuit board in the execution of processes related to mounting of electronic components onto a circuit board, as well as a technique for determining whether to execute a process related to mounting of electronic components onto a circuit board. Such techniques are utilized primarily in techniques for printing bonding material onto a circuit board in mounting of electronic components or for mounting (placing) electronic components onto a circuit board.

Conventionally, it has been practiced to identify specified printing positions or mounting positions on a circuit board on the basis of an image acquired by image pickup of the circuit board in the execution of processes related to the mounting of electronic components onto a circuit board such as printing of solder paste involved in the mounting of electronic components or mounting of the electronic components onto a circuit board, or a printed circuit board.

For example, Japanese unexamined patent publication No. 63-74530 A discloses a technique for acquiring positions (position data) of two marks previously provided on a circuit board to calculate an expansion ratio of the circuit board, and determining a mounting position of an electronic component on the circuit board has been corrected by the expansion ratio.

Also, Japanese unexamined patent publication No. 11-154799 A discloses a technique for acquiring positions of four or more marks provided on a circuit board, determining positional correction amounts from a plurality of combinations of three marks selected from among those four marks, respectively, and determining a mounting position corrected by using an average value of the positional correction values of all the combinations.

SUMMARY OF THE INVENTION

In recent years, flexible circuit boards, exemplified by FPCs (Flexible Printed Circuit boards), have been used more and more, and FPCs have an issue that they are more liable to warp and deform as compared with conventional so-called rigid boards. For example, in a case of a warped FPC, there are some cases where the FPC would partly float in a conveyance tray which holds flexible FPCs set on its top, making it impossible to correctly acquire positions of some marks. In another case of a plurality of FPCs which are held on one conveyance tray, in which case one reference position for all these FPCs is determined by using a plurality of marks and then processes related to the mounting of electronic components based on the reference position are executed, if some of the FPCs of which the positions of the marks are to be detected have been warped or rotated or deformed, it would be impossible to correctly determine the reference position, posing a possibility that most of FPCs may be processed as they have been displaced.

Further, high precision mounting of electronic components have also been in practical use in recent years, in which case there occur similar problems as with FPCs in the process of acquiring the reference position for mounting even in rigid boards.

Accordingly, an object of the present invention is to provide, for solving the above-described issues, a reference position determining method and reference position determining device for electronic component mounting, a printing method and printing apparatus for bonding material to be used for electronic component mounting, a mounting method for electronic components, and a processing control method for electronic component mounting, in any of which the reference position for the execution of processes related to the mounting of electronic components onto circuit boards can be determined with high precision and moreover vain execution of the processes related to the mounting of electronic components onto circuit boards can be prevented.

In order to achieve the above object, the present invention has the following constitutions.

According to a first aspect of the present invention, there is provided a reference position determining method for electronic component mounting, to determine a reference position for a circuit board in execution of a process related to mounting of electronic components onto the circuit board, the method comprising:

acquiring respective positional data for positions of three or more reference-position-determining marks which are provided on one or more circuit boards to be integrally treated in the process;

specifying a displaced mark out of the three or more marks, by determining relative positional relations of the individual positions with respect to the three or more marks and then comparing the determined positional relations with a predetermined reference positional relation; and determining the reference position for the one or more circuit boards by using the individual positional data of two or more marks resulting from excluding the displaced mark specified out of the three or more marks.

According to a second aspect of the present invention, there is provided the reference position determining method for electronic component mounting as defined in the first aspect, wherein in specifying the displaced mark, lengths of a plurality of line segments interconnecting the individual positions of the three or more marks are determined as the relative positional relations for the three or more marks, and the lengths of the individual line segments are compared with predetermined threshold values of length corresponding to the line segments, by which the displaced mark is specified.

According to a third aspect of the present invention, there is provided the reference position determining method for electronic component mounting as defined in the first aspect, wherein in specifying the displaced mark, distances between a reference center of the individual marks and positions of the individual marks are determined as the relative positional relations for the three or more marks, and the distances are compared with predetermined threshold values corresponding to the individual distances, by which the displaced mark is specified.

According to a fourth aspect of the present invention, there is provided the reference position determining method for electronic component mounting as defined in the third aspect, wherein the reference center for the positions of the marks is a centroid or circumcenter for the respective positions of the marks.

According to a fifth aspect of the present invention, there is provided the reference position determining method for electronic component mounting as defined in the first aspect, further comprising:

before specifying the displaced mark, specifying a bad circuit board which is to be excluded from the plurality of circuit boards as objects of electronic component mounting, wherein in specifying the displaced mark, only the marks provided on the circuit boards other than the specified bad circuit board among the plurality of circuit boards are treated as the three or more marks.

According to a sixth aspect of the present invention, there is provided the reference position determining method for electronic component mounting as defined in the first aspect, wherein after acquiring the positional data of the individual marks, and before specifying the displaced mark, relative positional relations of the three or more marks are determined, and compared with the reference positional relation, by which it is decided whether or not processing of specifying the displaced mark is executed.

According to a seventh aspect of the present invention, there is provided the reference position determining method for electronic component mounting as defined in the sixth aspect, wherein in the decision as to whether or not processing of specifying the displaced mark is executed, execution of processing of specifying the displaced mark is determined by referencing a criterion that a result of the comparison with the reference positional relation falls within a first permissible range, and in specifying the displaced mark, one of the marks of which a result of the comparison with the reference positional relation falls outside a second permissible range which is different from the first permissible range is specified as the displaced mark.

According to an eighth aspect of the present invention, there is provided a bonding material printing method for printing bonding material for use of electronic component mounting onto a circuit board on basis of printing patterns, the method comprising:

determining the reference position, by executing the reference position determining method for electronic component mounting as defined in the first aspect while holding the one or more circuit boards;

performing alignment between the held one or more circuit boards and a screen having opening portions which allow the bonding material to be passed through and which are formed in correspondence to the printing patterns on basis of the determined reference position, and then setting the screen onto the one or more circuit boards; and thereafter, feeding the bonding material onto the one or more circuit boards through the opening portions of the screen, and executing printing of the bonding material corresponding to the printing patterns.

According to a ninth aspect of the present invention, there is provided an electronic component mounting method for mounting an electronic component onto a mounting position of the electronic component on a circuit board, the method comprising:

determining the reference position, by executing the reference position determining method for electronic component mounting as defined in the first aspect while holding one or more circuit boards;

performing alignment between the electronic component and the mounting position in the circuit board of the one or more circuit boards on basis of the determined reference position; and thereafter, mounting the electronic component to the mounting position in the circuit board.

According to a tenth aspect of the present invention, there is provided a reference position determining device for electronic component mounting, to determine a reference position for a circuit board in execution of a process related to mounting of electronic components onto the circuit board, the device comprising:

an image pickup device for picking up an image of the one or more circuit boards to be integrally treated in the process in a state the circuit boards are held;

a mark position acquisition section for acquiring positional data for respective positions of three or more reference-position-determining marks provided on the one or more circuit boards from the image picked up by the image pickup device;

a displaced mark specifying section for determining relative positional relations of the individual positions with respect to the three or more marks, and comparing the determined positional relations with a predetermined reference positional relation, thereby specifying a displaced mark out of the three or more marks; and a reference position determining section for determining the reference position for the one or more circuit boards by using the individual positional data of two or more marks resulting from excluding the displaced mark specified out of the three or more marks.

According to an eleventh aspect of the present invention, there is provided a printing apparatus for printing bonding material for use of electronic component mounting onto a circuit board on basis of printing patterns, the apparatus comprising:

a holding device for holding the one or more circuit boards;

the reference position determining device for electronic component mounting as defined in the tenth aspect, the mounting being performed onto the one or more circuit boards held by the holding device;

an alignment device for performing alignment between the holding device and a screen having opening portions which allow the bonding material to be passed through and which are formed in correspondence to the printing patterns, on basis of the reference position determined by the reference position determining device, and setting the screen onto the one or more circuit boards held by the holding device; and a bonding material feeding device for feeding the bonding material onto the circuit boards through the opening portions of the screen set on the circuit boards by the alignment device, and performing printing of the bonding material corresponding to the printing patterns.

According to a twelfth aspect of the present invention, there is provided a process control method for electronic component mounting to decide execution of a process which is related to mounting of an electronic component onto a circuit board before starting of the process, the method comprising:

acquiring positional data for respective positions of three or more reference-position-determining marks provided on one or more circuit boards to be integrally treated in the process;

determining relative positional relations of the individual positions with respect to the three or more marks, and then comparing the determined positional relations with a predetermined reference positional relation; and determining whether or not the process for the one or more circuit boards is started on basis of a result of the comparison.

According to the present invention, in a reference position determining method for electronic component mounting, by which in execution of a process related to mounting of electronic components onto a circuit board, the reference position for the circuit board is determined, it becomes implementable, with high precision and by a convenient method, to determine the reference position for one or more circuit boards, which are integrally treated in the process, by using three or more reference-position-determining marks provided on the one or more circuit boards.

More specifically, positional data for positions of the three or more reference-position-determining marks are recognized, and relative positional relations of the recognized individual positions are compared with a reference positional relation, by which a displaced mark can be specified efficiently. For example, in a case where the circuit boards are FPCs, as it can occur that the marks may be displaced due to warps, contraction, floating or the like of the FPCs, any mark that has been displaced (positional sifted) can reliably be specified even in such cases.

Thereafter, by calculating a reference position with the marks remaining after excluding the displaced mark, the reference position for the process on the one or more circuit boards can be determined with high precision and high efficiency. Thus, by the reference position being determined with high precision, it becomes implementable to fulfill high-precision positioning, allowing the process to be executed with reliability.

Further, by making a comparison of the relative positional relations with the use of a two-stage (two kinds of) decision criterion, it becomes possible to prevent vain execution of unnecessary processes by blocking the execution of subsequent processes for circuit boards containing largely displaced marks.

Furthermore, such a reference position determining method as shown above can be applied to printing of bonding material, which is one process of processes for electronic component mounting, or to the mounting (placing) of electronic components.

BRIEF DESCRIPTION OF THE DRAWINGS

These and other aspects and features of the present invention will become clear from the following description taken in conjunction with the preferred embodiments thereof with reference to the accompanying drawings, in which:

FIG. 11A is a plan view and FIG. 11B is a side view;

FIG. 14 is a view showing a table for specifying displaced object marks in FPCs from line segments having abnormalities in their lengths;

DETAILED DESCRIPTION OF THE PREFERRED EMBODIMENTS

Figure 1:
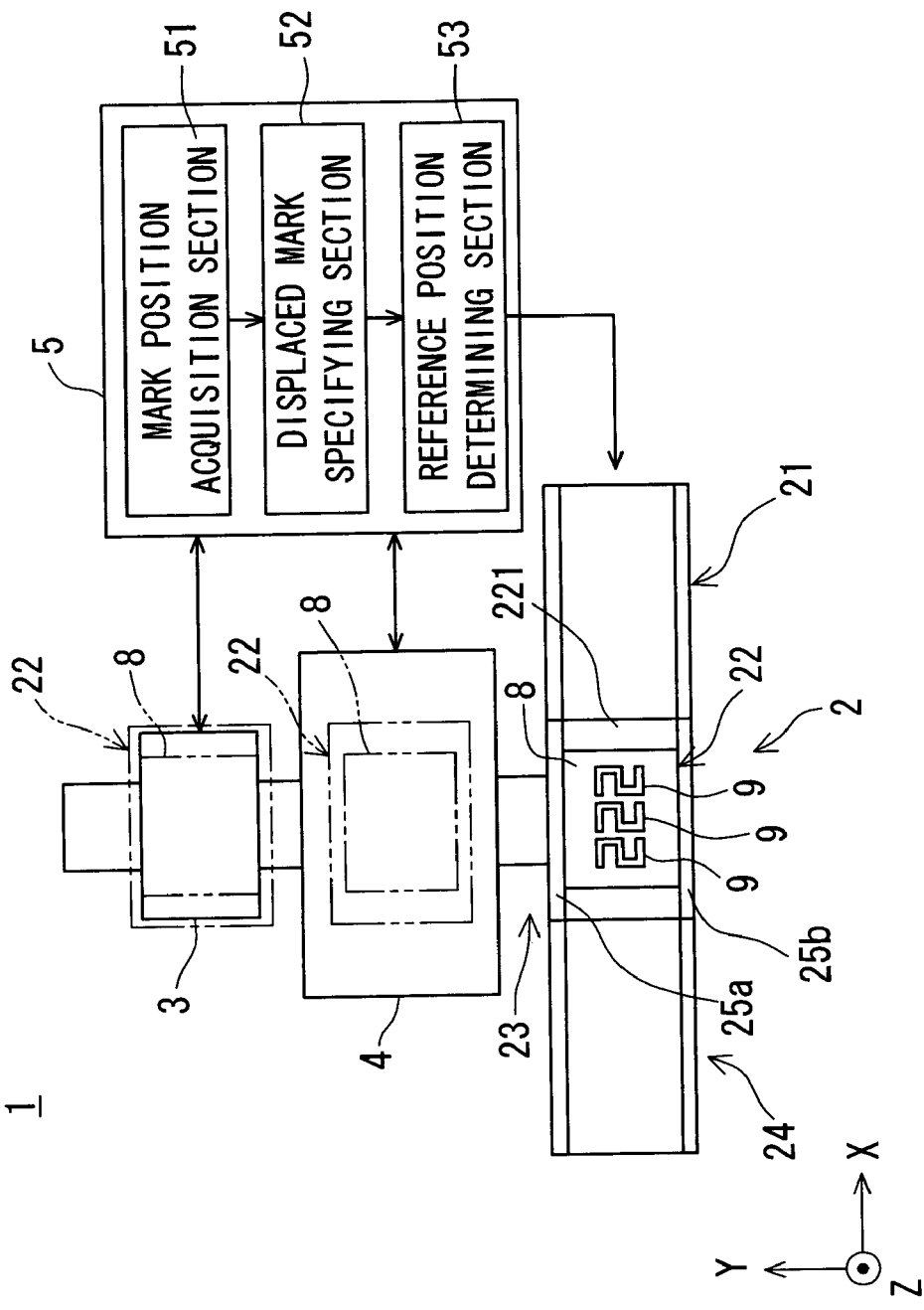
FIG. 1 is a view showing the configuration of a printing apparatus of one embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

FIG. 1 is a view showing the configuration of a printing apparatus 1 according to one embodiment of the invention. The printing apparatus 1 includes a conveyance device 2 for conveying a conveyance tray 8 having a plurality of flexible circuit boards (hereinafter, referred to as "FPCs") held on its upper surface, an image acquisition device 3 for acquiring an image of the FPCs 9, a printing device 4 for printing solder paste, which is a viscous material for electronic component mounting, onto the FPCs 9, and a control device 5 for performing overall control on the printing apparatus 1.

The conveyance device 2 has a loader 21 for carrying the conveyance tray 8 into the printing apparatus 1, a stage section 22 for holding the carried-in conveyance tray 8, a stage section moving device 23 for moving the stage section 22 in a Y direction in FIG. 1, and an unloader 24 for carrying the FPCs 9, which have been printed with solder paste, out of the printing apparatus 1. The conveyance tray 8 on the stage section 22 is moved by the stage section moving device 23 to the image acquisition device 3 and the printing device 4.

The control device 5 has a mark position acquisition section 51 for extracting information from image data inputted from the image acquisition device 3 to thereby acquire positional data for positions of a plurality of respective reference-position-determining marks (hereinafter, referred to as "marks") provided on the FPCs 9, a displaced mark specifying section 52 for specifying displaced marks out of the plurality of marks, and a reference position determining section 53 for determining a reference position for the plurality of FPCs 9 on the conveyance tray 8 based on the remaining marks of the plurality of marks excluding the displaced marks. It is noted that the displaced mark (position-shifted mark) is a mark including a displacement between designed reference position and actual placed position in its positional data. That is, the displaced mark has positional data such as a positional coordinate which is shifted from a predetermined position to be placed in an arrangement thereof.

Figure 2:
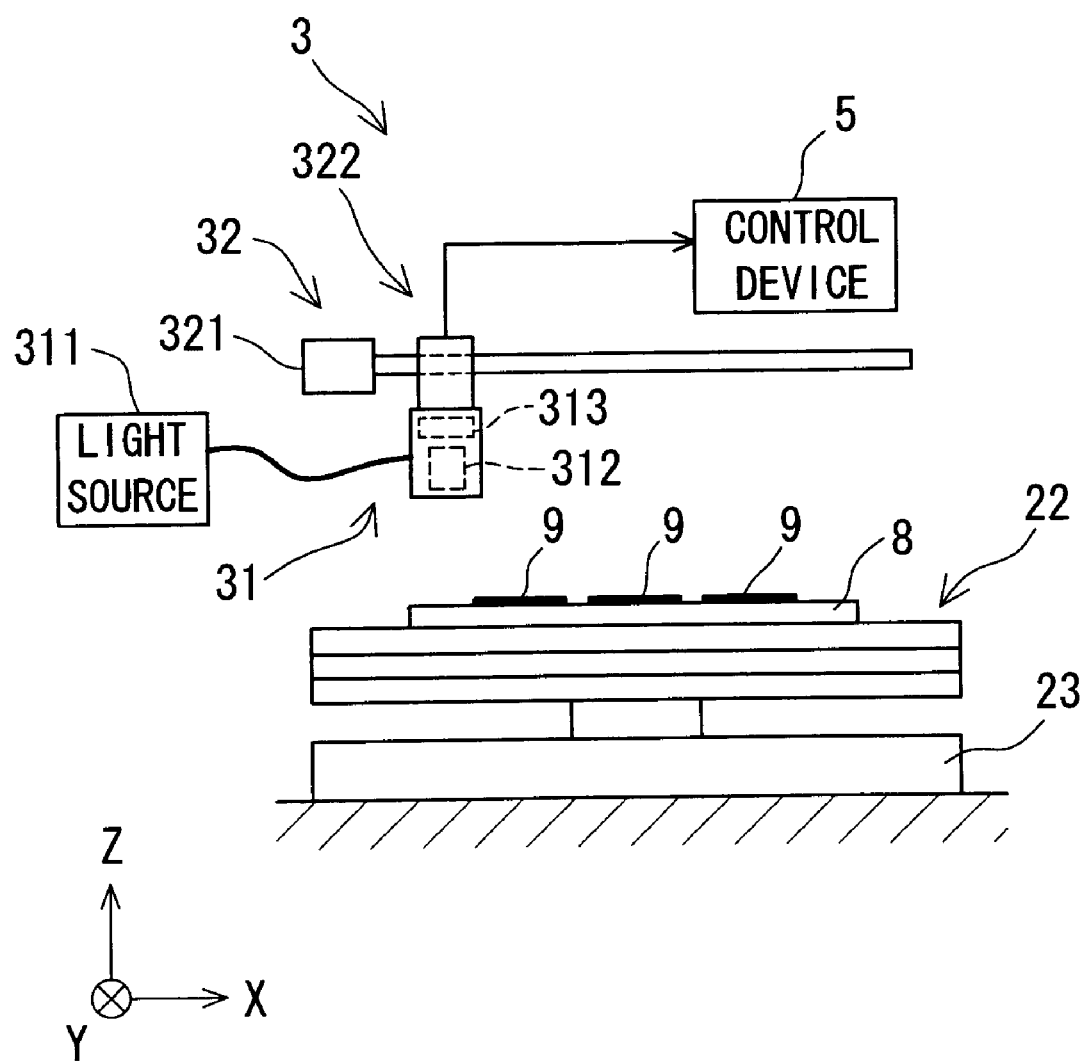
FIG. 2 is a view showing the configuration of an image acquisition device included in the printing apparatus of FIG. 1.

FIG. 2 is a view showing the configuration of the image acquisition device 3, as viewed from a (−Y) side toward a (+Y) direction. The image acquisition device 3 has an image pickup section 31 for acquiring an image of a plurality of FPCs 9 held on the conveyance tray 8, and an image-pickup-section moving device 32 for moving the image pickup section 31 along an X direction in FIG. 2. The image pickup section 31 has a light source 311 which emits illumination light, an optical system 312 which leads the illumination light derived from the light source 311 to the FPCs 9 on the conveyance tray 8 and on which light derived from the FPCs 9 comes incident, and an image pickup element 313 which converts an image of the FPCs 9 formed by the optical system 312 into an electric signal, where image data of the FPCs 9 is outputted from the image pickup element 313 to the control device 5. The image-pickup-section moving device 32 has a ball screw mechanism 322 connected to a motor 321, and the image pickup section 31 is moved along a horizontal direction (X direction) vertical to the move direction of the stage section 22 (i.e., Y direction) by rotation of the motor 321.

Figure 3:
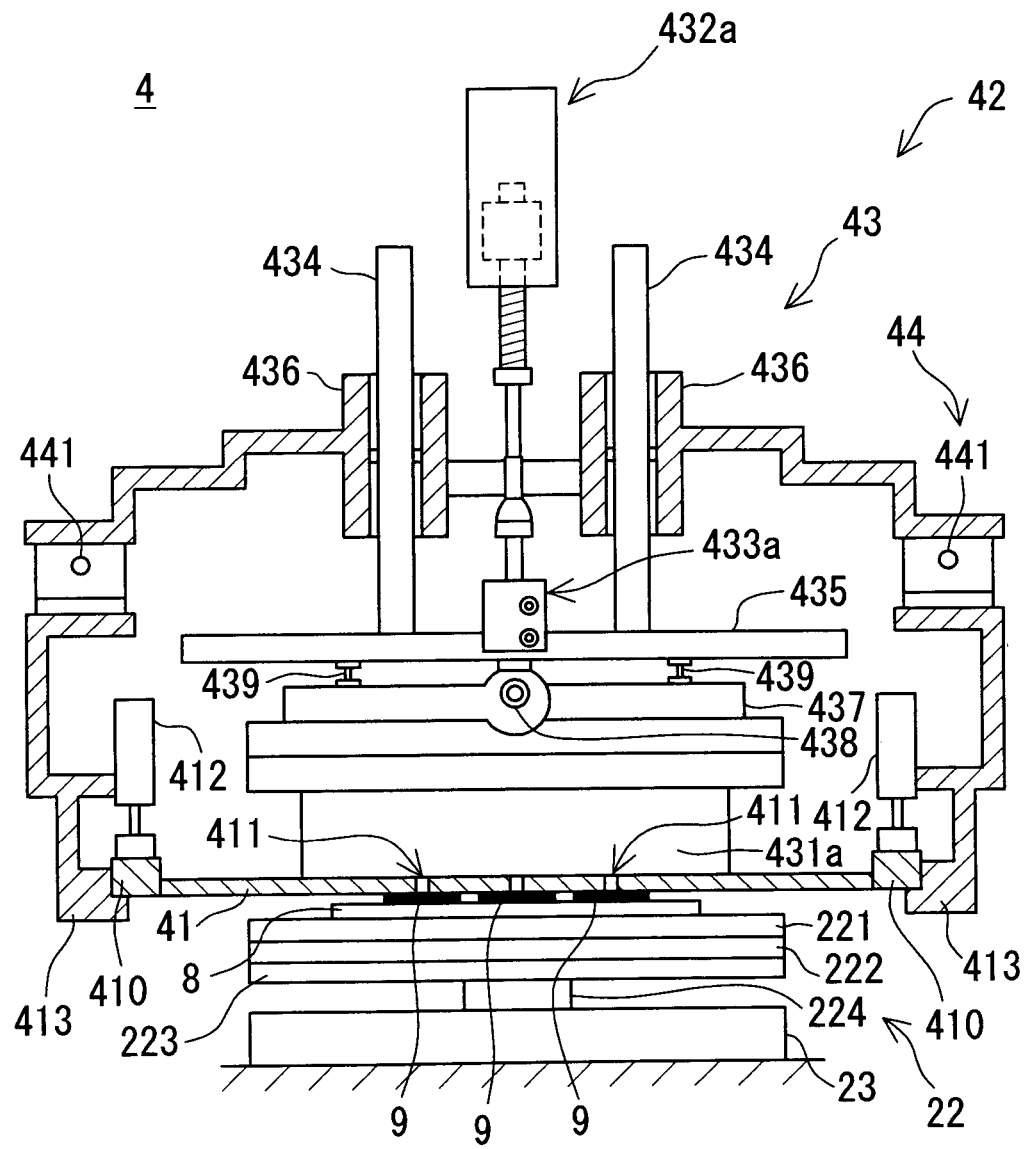
FIG. 3 is a front view showing the configuration of a printing device included in the printing apparatus of FIG. 1.
Figure 4:
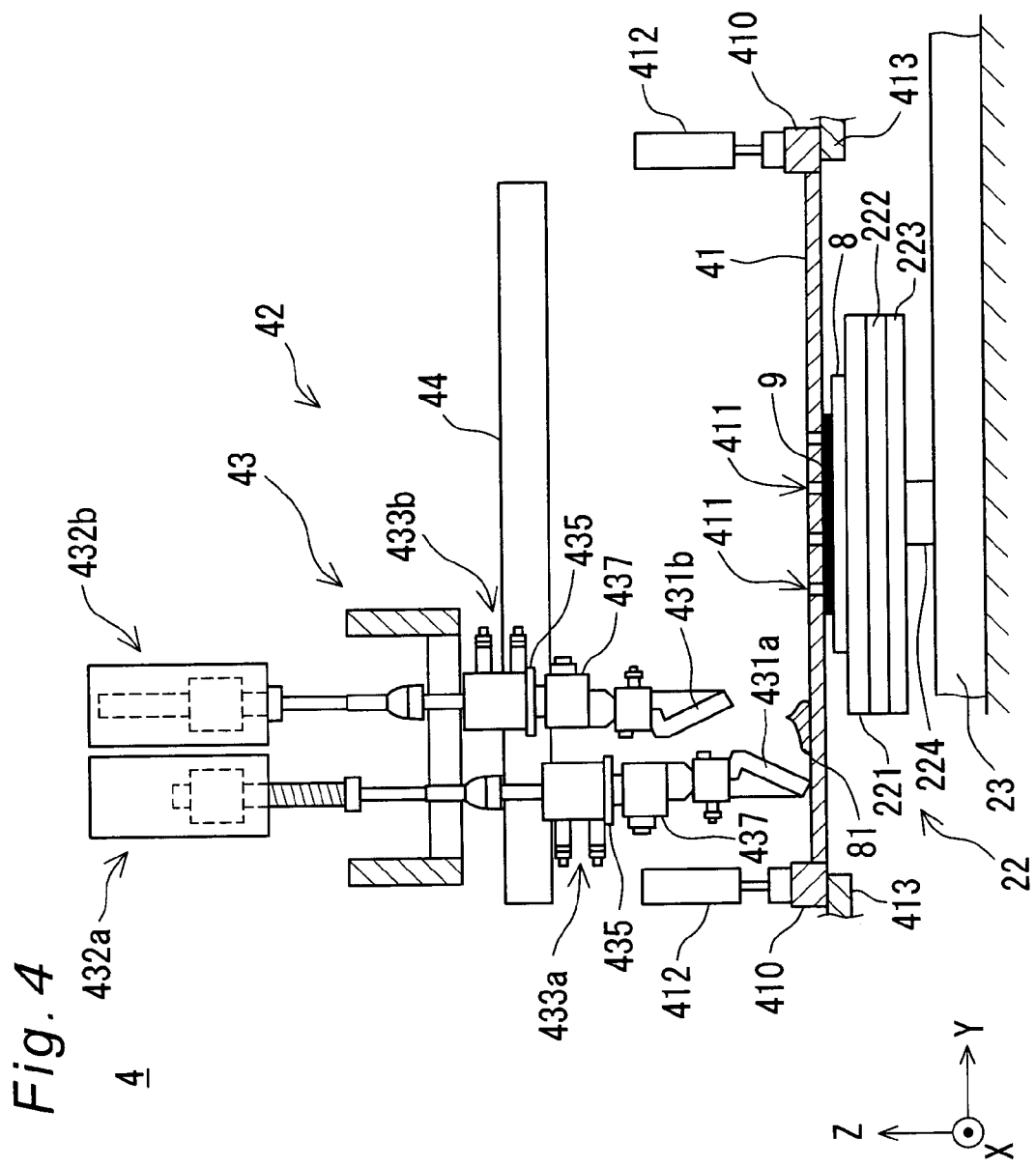
FIG. 4 is a right side view showing the configuration of the printing device.

FIG. 3 is a front view showing the configuration of the printing device 4, and FIG. 4 is a right side view of the printing device 4 as viewed from a (+X) side toward a (−X) direction. FIGS. 3 and 4 show a state in which the stage section 22 is positioned at the printing device 4. In addition, FIGS. 3 and 4 show a partly represented cross section for an easier understanding of the configuration, with the thickness of a screen 41 emphasized.

The printing device 4 has a thin-sheet like screen 41 which has an opening portion 411 formed in correspondence to a printing pattern, and a squeegee mechanism 42 (an example of the bonding material feeding device) which moves and pushes (i.e., squeegees) solder paste (an example of the bonding material) 81 (see FIG. 4) set on the screen 41 to thereby fill the solder paste 81 into the opening portion 411 of the screen 41. The screen 41 is replaceably fixed by an arrangement that a frame 410 provided on its periphery is pinched between a cylinder 412 and a supporting portion 413.

The squeegee mechanism 42 includes a head section 43 and a head-section moving mechanism 44 which moves the head section 43 along the Y direction, where the head-section moving mechanism 44 is so structured that a drive-source motor is connected to a ball screw mechanism 441. The head section 43, as shown in FIG. 4, has two squeegees which are arrayed so as to be opposed to each other in the Y direction (move direction of the head section 43) and to sandwich therebetween the solder paste 81 set on the screen 41 (hereinafter, the (−Y) side squeegee will be referred to as "first squeegee" 431a and the (+Y) side squeegee as "second squeegee" 431b). The first squeegee 431a and the second squeegee 431b are formed of for example urethane rubber. In the squeegee mechanism 42, as the head-section moving mechanism 44 moves the head section 43 in the Y direction, the first squeegee 431a and the second squeegee 431b are moved both (i.e., integrally) in the Y direction.

The head section 43 includes two squeegee up/down mechanisms 432a, 432b for moving (lifting or lowering) the first squeegee 431a and the second squeegee 431b in a Z direction respectively and independently of each other, and two pressing mechanisms 433a, 433b for pressing the first squeegee 431a and the second squeegee 431b against a (+Z) side surface (i.e., the top surface) of the screen 41, respectively, and independently of each other.

As shown in FIG. 3, the pressing mechanism 433a is fitted to a frame 435 having two guide rods 434 extending in the Z direction, and the guide rods 434 are guided in the Z direction by bushings 436. Below (on the (−Z) side of) the frame 435, a frame 437 is fitted to the frame 435 so as to be rotatable about a shaft 438 extending in the Y direction, and the rotational range of the frame 437 is restricted by a stopper 439. Likewise, the pressing mechanism 433b shown in FIG. 4 is fitted to another frame 435, and the second squeegee 431b is fitted below the frame 435 via another frame 437.

As shown in FIGS. 3 and 4, the stage section 22 includes a stage 221 for holding the conveyance tray 8 via a suction plate (not shown), a stage rotating mechanism 222 for rotating the stage 221 within an X-Y plane about an axis facing the Z direction, a stage position correcting mechanism 223 for slightly moving the stage 221 in the X direction, and a stage up/down mechanism 224 which moves the stage 221 in the Z direction and which is connected to the stage section moving device 23.

Figure 5:
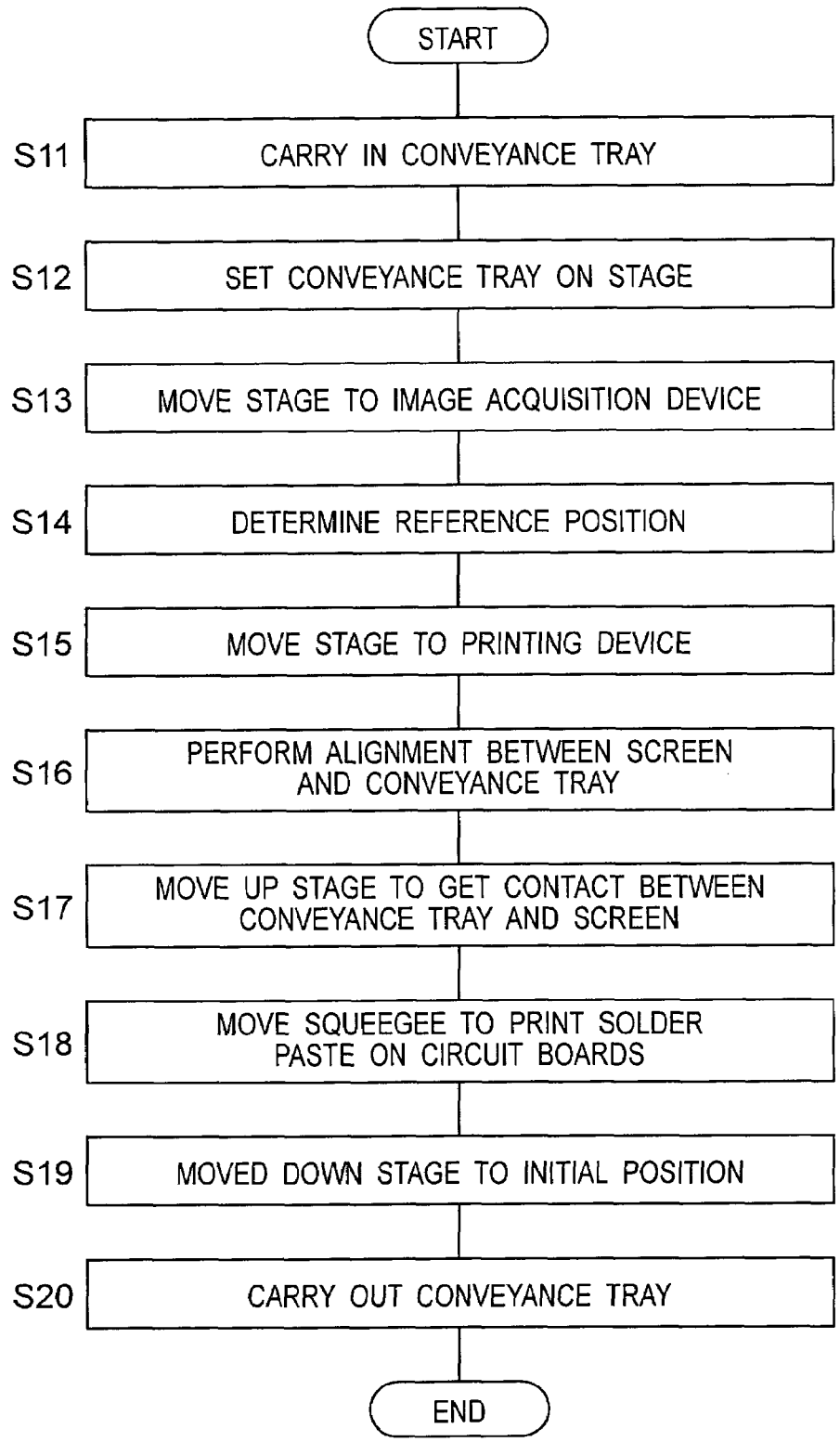
FIG. 5 is a flowchart showing the processing flow of printing solder paste on individual circuit boards by the printing apparatus.

FIG. 5 is a view showing the processing flowchart of printing solder paste on the FPCs 9. In the printing apparatus 1, first, the conveyance tray 8 holding the FPCs 9 is carried into the printing apparatus 1 by the loader 21 (step S11).

Figure 6:
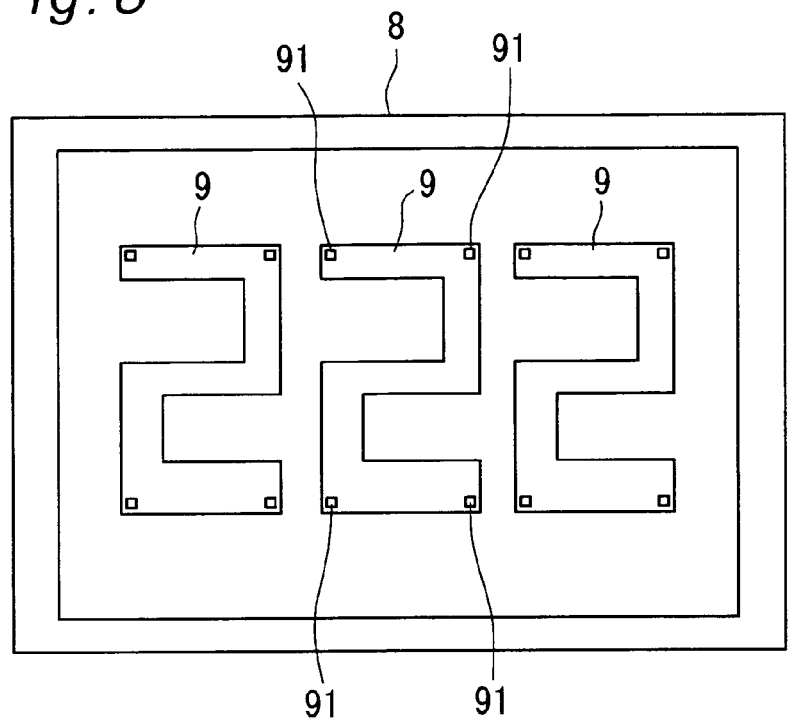
FIG. 6 is a view showing the individual circuit boards (circuit boards before printing) held on the conveyance tray of the printing apparatus.

FIG. 6 is a view illustrating a plurality of FPCs 9 held on the conveyance tray 8. As shown in FIG. 6, the plurality of FPCs 9, as arrayed in specified orientations, are adhesively bonded to adhesive rubber on the conveyance tray 8, with interconnect patterns formed on the respective FPCs 9. Also, specified marks 91 for reference position determination (position recognition) are formed at four corners of the FPCs 9, respectively. In the following description, an ideal (i.e., design) array of a plurality of FPCs 9 which are arrayed with predetermined intervals and posture (orientation) are referred to as reference array.

The conveyance tray 8 is conveyed in the (+X) direction by the loader 21 and further conveyed by a pair of conveyance rail portions 25a, 25b between the loader 21 and the unloader 24 so as to reach the front of the printing device 4 (hereinafter, referred to as "initial position"). At this point, the conveyance tray 8 is stopped from moving by a stopper at the front of the printing device 4. Then, an adjustor pin of the stage section 22 is inserted into a hole portion (not shown) provided in the conveyance tray 8, by which positioning of the conveyance tray 8 is achieved. Thereafter, the distance between the conveyance rail portions 25a, 25b is narrowed so that the conveyance rail portions 25a, 25b are brought into contact with side faces of the conveyance tray 8, the posture of the conveyance tray 8 being thereby adjusted, and the stage 221 moves up so that the conveyance tray 8 is set on the stage 221 via the suction plate (step S12).

The stage section 22 is moved along with the conveyance rail portions 25a, 25b to the image acquisition device 3 by the stage section moving device 23 (step S13), where a printing reference position for a plurality of FPCs 9 is acquired (determined) (step S14). The reference position for the FPCs 9 is utilized for positioning against the screen 41 in later-described processing in the printing device 4. It is noted that the processing for determining the reference position in this step S14 will be described in detail after the description of overall processing in the printing apparatus 1. The term "reference position" refers to a common reference position which, with regard to individual FPCs 9 that are held in placement on the conveyance tray 8 so as to keep an integral placement relation, is to be used for positioning of the FPCs 9 kept in the integral state in later processing, for example, printing process.

Once the reference position has been determined, the stage section 22 is moved to the printing device 4 (step S15), where alignment between the screen 41 and the conveyance tray 8 shown in FIGS. 3 and 4 is performed based on the reference position (step S16). More specifically, the stage 221 is slightly moved in the Y direction by the stage section moving device 23 and moreover slightly moved in the X direction by the stage position correcting mechanism 223 so that a center of a region occupied by the plurality of FPCs 9 becomes coincident with a center of the screen 41. Moreover, the stage rotating mechanism 222 is also controlled as required, so that the plurality of FPCs 9 are adjusted in their posture (equivalent to rotational angle) in correspondence to the screen 41. Subsequently, the stage 221 is moved up by the stage up/down mechanism 224 until the conveyance tray 8 comes into contact with the (−Z) side principal plane of the screen 41 with the FPCs 9 sandwiched therebetween (step S17). It is noted that FIGS. 3 and 4 show a state in which the conveyance tray 8 is in contact with the screen 41, while the conveyance rail portions 25a, 25b are not shown. Actually, the conveyance rail portions 25a, 25b have such a height as not to interfere with the screen 41.

Once the FPCs 9 on the stage 221 have been brought into contact with the screen 41, the first squeegee 431a is moved down by the squeegee up/down mechanism 432a in the head section 43 preparatorily located on the (−Y) side of the opening portion 411 as shown in FIG. 4 until a lower end of the first squeegee 431a is brought into contact with the (+Z) side principal plane of the screen 41. At this time point, the second squeegee 431b has preparatorily been positioned at a specified height away from the (+Z) side principal plane of the screen 41. Then, the first squeegee 431a is pressed against the screen 41 with a specified pressing force by the pressing mechanism 433a.

Subsequently, along with the head section 43, the first squeegee 431a and the second squeegee 431b are moved toward the (+Y) side along the principal plane of the screen 41. In this operation, the first squeegee 431a is moved in a state of keeping in contact (being pressed against) with the screen 41 so as to push out (squeegee) the solder paste 81 on the screen 41 toward the (+Y) direction and thereby fill the solder paste 81 into the opening portion 411 of the screen 41. In this way, by the head-section moving mechanism 44 moving the first squeegee 431a on the screen 41, the solder paste 81 set on the screen 41 is printed onto the plurality of FPCs 9 via the opening portion 411 (step S18).

When the filling of the solder paste into the opening portion 411 by the first squeegee 431a is completed, the pressing of the first squeegee 431a against the screen 41 is released in the pressing mechanism 433a, so that the first squeegee 431a is moved up by the squeegee up/down mechanism 432a so as to be separated from the screen 41. Thereafter, the stage 221 is moved down by the stage up/down mechanism 224, and the FPCs 9 are separated from the screen 41 while the solder paste filled into the opening portions 411 keeps sticking to the principal plane, where the stage section 22 is moved to the initial position (step S19). The conveyance tray 8 is transferred from on the stage 221 to the unloader 24, thus the conveyance tray 8 being carried out (step S20).

In addition, although details are omitted in description, printing operation on FPCs 9 set on the succeeding conveyance tray 8 is carried out with the first squeegee 431a and the second squeegee 431b replaced with each other, as compared with the foregoing printing operation.

Figure 7:
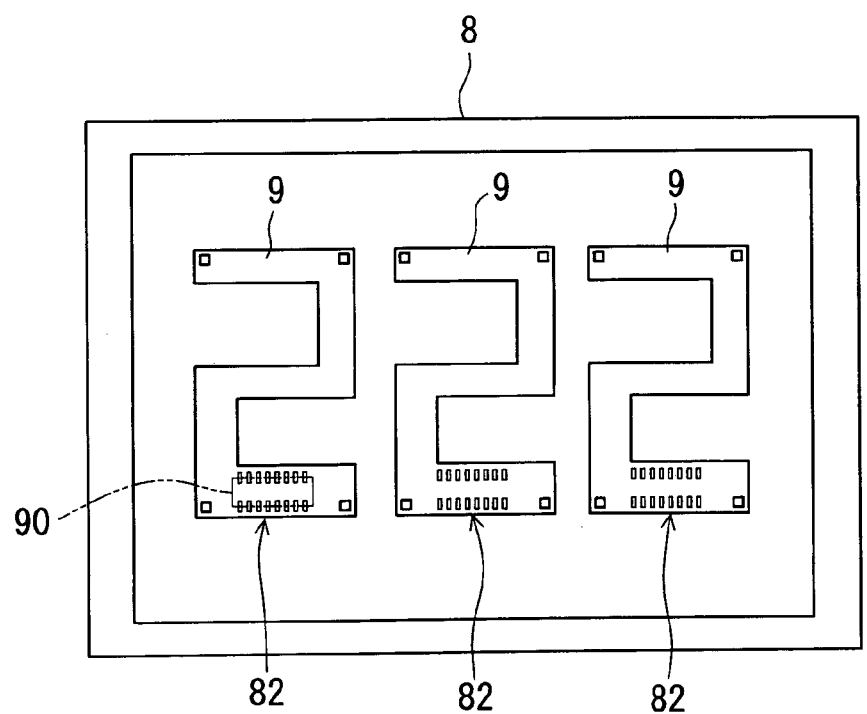
FIG. 7 is a view showing the individual circuit boards after printing.

FIG. 7 is a view illustrating the FPCs 9 after the printing. As shown in FIG. 7, patterns 82 (e.g., a plurality of electrode patterns formed at a pitch of 400 μm) of solder paste are printed at specified positions on the plurality of FPCs 9, respectively. The FPCs 9 carried out from the unloader 24 are subjected to electronic component mounting and reflow by the succeeding-stage apparatus in succession, thus the electronic component mounting onto the FPCs 9 is completed. In the case of FIG. 7, in which one mounted electronic component 90 is depicted by chain double-dashed line, when the electronic components 90 are mounted to all of necessary places, the FPCs 9 become circuit boards in each of which a circuit containing the electronic component 90 is provided.

Figure 8:
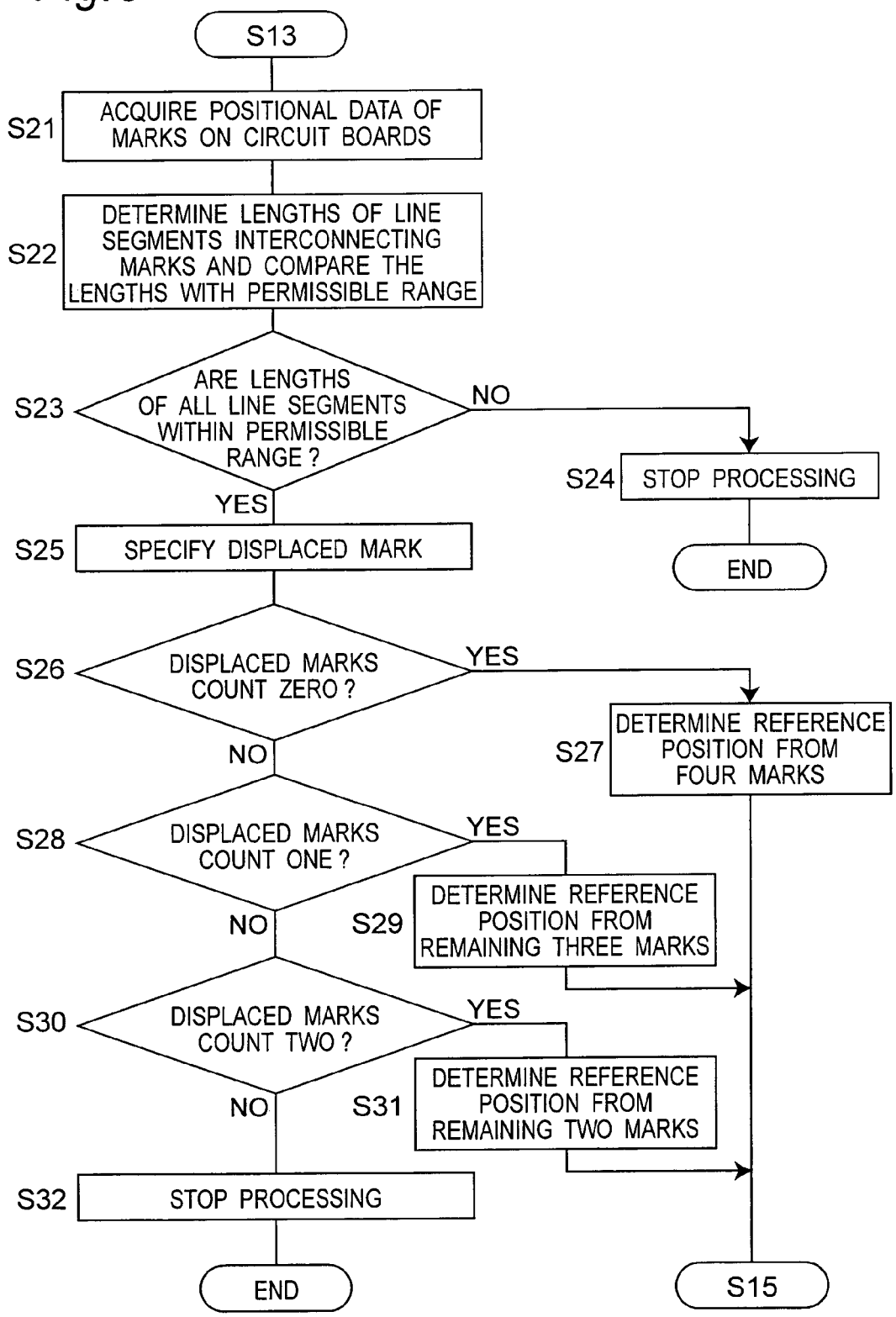
FIG. 8 is a flowchart showing the processing flow of acquiring reference positions of the circuit boards, respectively, in the printing apparatus.

Next, a process for determining the reference position in step S14 of FIG. 5 is explained. FIG. 8 is a flowchart showing the processing flow of determining reference positions, showing a process to be executed at step S14.

Figure 9:
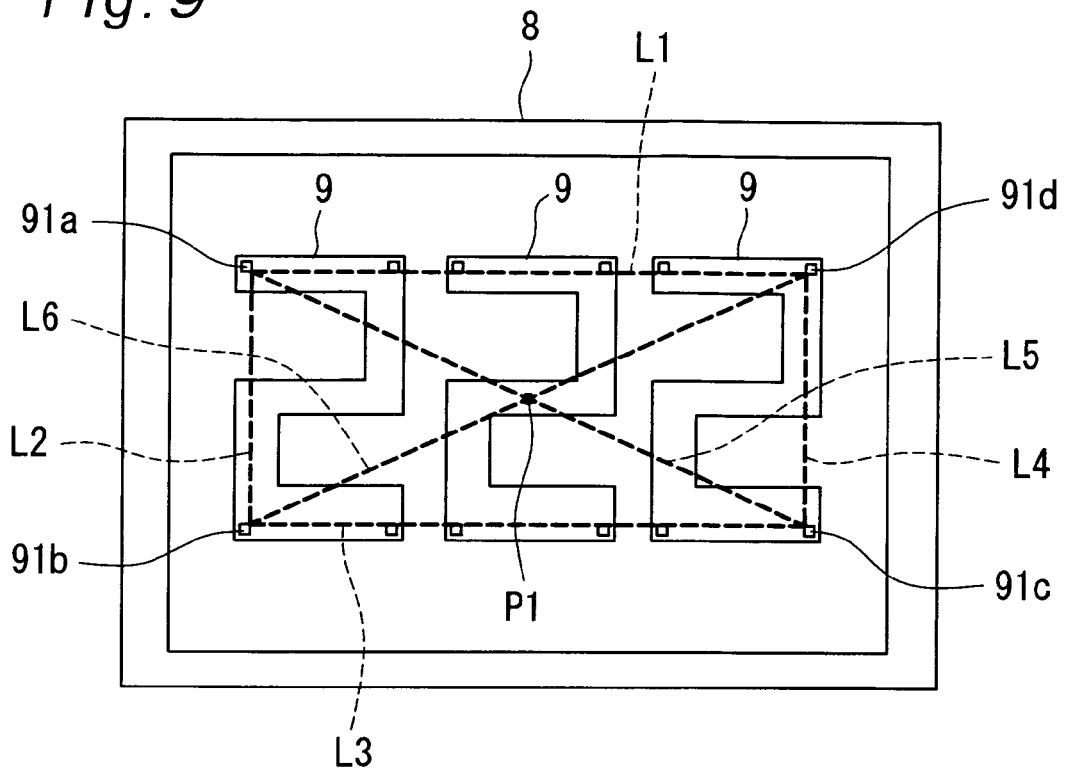
FIG. 9 is a view showing the individual circuit boards on the conveyance tray, including the representation of line segments made by interconnecting individual object marks.

As the conveyance tray 8 on the stage 221 is moved to the image acquisition device 3 (FIG. 5, step S13), the plurality of predetermined reference-position-determining marks (hereinafter, referred to as "object marks") 91 on the plurality of FPCs 9 are picked up as images, respectively. For example, on a predetermined assumption that left-side two marks 91a, 91b on the left-side of FPC 9 as well as the right-side two marks 91c, 91d on the right-side of FPC 9 as shown in FIG. 9 are used as object marks, the image pickup position of the image pickup section 31 is set to vicinities of the four object marks 91a-91d in succession by the stage section moving device 23 and the image-pickup-section moving device 32 of FIG. 2, so that images of the four object marks 91a-91d (hereinafter, referred to as "mark images") are acquired respectively. The mark images are outputted to the control device 5, and their pattern matching with patterns previously registered in the control device 5 in association with the individual mark images is executed in the mark position acquisition section 51, by which respective positional data for positions, i.e. position coordinates in the X-Y plane, of the four object marks 91a-91d provided on the plurality of FPCs 9 are acquired (step S21). Although the following description will be given on the assumption that the four object marks 91a-91d are preset on the plurality of FPCs 9, the number of object marks is not limited as long as it is not less than three. Besides, although there are no particular restrictions as to which marks 91 should be selected as the object marks from among a plurality of marks 91, marks 91 located more away from one another may preferably be selected, taking into consideration that the reference position is determined by using the selected marks 91, because the reference position can be determined with higher precision.

Figure 10:
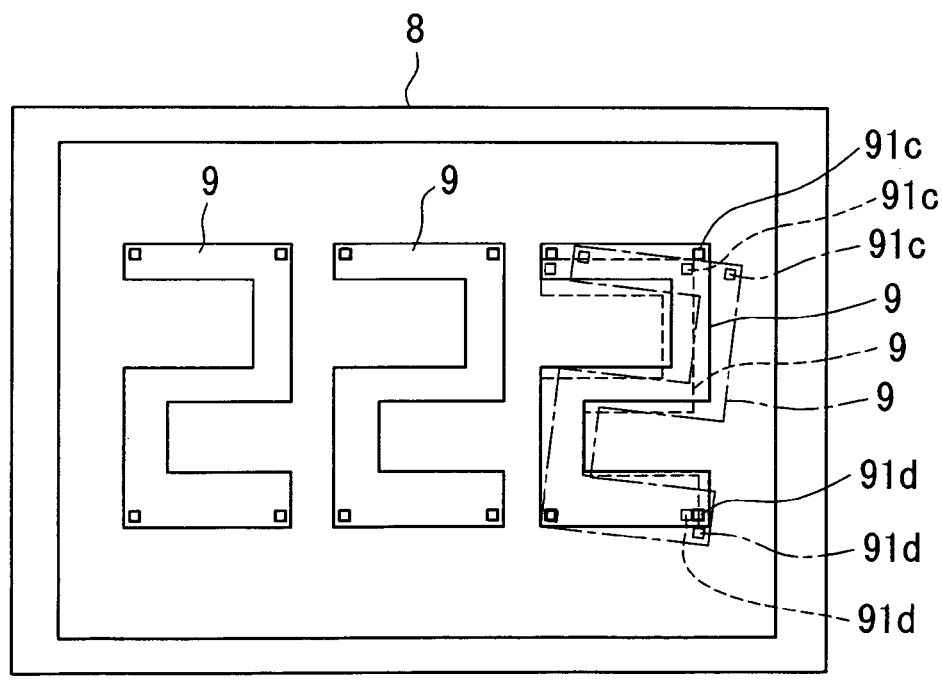
FIG. 10 is a view showing the individual circuit boards on the conveyance tray, showing a state in which an arrangement of one circuit board includes a displacement.
Figure 11A:
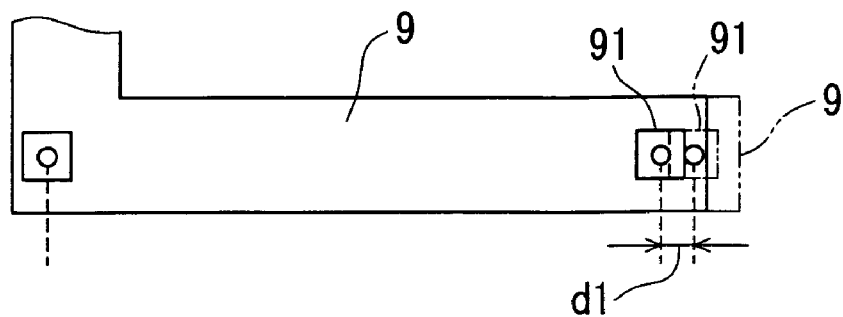
FIGS. 11A and 11B are views showing part of a circuit board on the conveyance tray, showing a state in which the circuit board has floated at its one end portion, where
Figure 11B:
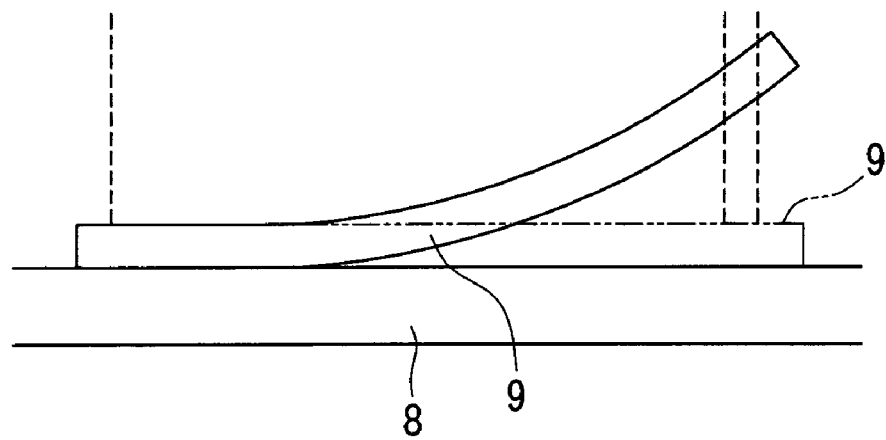

Here is explained a relationship between the holding state of the FPCs 9 on the conveyance tray 8 and the positions of the object marks 91a-91d. FIG. 10 is a view showing an example of three FPCs 9 arrayed and held on the conveyance tray 8. FIGS. 11A and 11B are views illustrating part of an FPC 9 held on the conveyance tray 8, where FIG. 11A shows part of the FPC 9 as viewed from the principal plane side and FIG. 11B shows the same as viewed from a side face.

As depicted by one-dot chain line in FIG. 10, in the case where the right-side placed FPC 9 out of the three FPCs 9 arrayed and held on the conveyance tray 8 is held on the conveyance tray 8 in a slightly rotated posture (orientation), the positions of the object marks 91c, 91d would also be rotated similarly, being displaced from the positions in the reference array of those three FPCs 9 (i.e., from the positions of the object marks 91c, 91d depicted by solid line in FIG. 10), respectively. Further, also in the case where the right-side FPC 9 is expansively or contractively deformed in size as depicted by dotted line in FIG. 10, the positions of the object marks 91c, 91d would be displaced from the positions in the reference array. Furthermore, in the case where the FPC 9 is warped on the conveyance tray 8 as shown in FIG. 11B, the position of the object mark 91 as viewed from the principal plane side would be displaced by a distance d1 from the position that would result with FPC 9 non-warped (i.e., the position in the reference array; depicted by chain double-dashed line in FIGS. 11A and 11B) as shown in FIG. 11A.

Moreover, such warps and bends that may occur to the FPC 9 might in some cases occur even due to warps or bends of the conveyance tray 8 itself.

At the displaced mark specifying section 52, six line segments L1-L6 are acquired by interconnecting two object marks out of the four object marks 91*a*-91*d* shown in FIG. 9, and lengths of the individual line segments L1-L6 are determined. Then, the lengths of the individual line segments L1-L6 are compared with an upper-limit value and a lower-limit value, i.e. a first permissible range, which are predetermined corresponding threshold values, by which it is confirmed whether or not the lengths of the individual line segments L1-L6 fall within the first permissible range (step S22).

In this case, the permissible range for the lengths of the individual line segments is set by referencing lengths of individual line segments between object marks in the reference array. Therefore, the FPCs 9 having the object marks 91*a*-91*d*, if having been deformed or rotated or warped or otherwise done as shown in FIG. 10 or FIG. 11, may be so decided that their lengths are outside the positional relation depending on the degree of the deformation, rotation, warp or the like. In a case of such a decision, it is decided that printing is not executed on the individual FPCs 9 on the conveyance tray 8 (step S23), and the printing process for the individual FPCs 9 is stopped or cancelled (step S24). The decision result is sent to the operator for notification (together with the mark image as required), and improperly held FPCs 9 are repositioned on the conveyance tray 8, followed by a return to step S21, or otherwise all the FPCs 9 are peeled off from the conveyance tray 8, followed by a skip of the process with this tray and a return to step S11. Further, adjustments for steps that cause the deformation, rotation, warp or the like of the FPCs 9, such as the step for placement of the FPCs 9 on the conveyance tray 8 performed before the processing in the printing apparatus 1, are executed as required. That is, step S23 can be said to be a step for deciding whether or not printing process programmed to be executed in the subsequent step can be started to be executed, by referencing whether or not the condition of being within the first permissible range is satisfied.

Next, if it is confirmed that all the line segments L1-L6 are within the first permissible range with respect to the FPCs 9 of FIG. 9 (step S23), the lengths of the line segments L1-L6 are compared with an upper-limit value and a lower-limit value, i.e. a second permissible range, which is different from the first permissible range. For example, the second permissible range defines another range substantively narrower than the first permissible range. Then, if there are some abnormal line segments whose length falls outside the second permissible range, the abnormal line segments are specified and an object mark or object marks that have been displaced are specified from combinations of the abnormal line segments (step S25).

A concrete method for specifying a displaced object mark from a plurality of abnormal line segments as shown above is explained with a table for specification of a displaced object mark shown in FIG. 14. In the table shown in FIG. 14, the individual line segments L1-L6 are evaluated as an expression of a cross mark 'X' when their length is larger than the upper-limit value or smaller than the lower-limit value (i.e., outside the second permissible range), and as an expression of a circle mark 'O' when their length is not more than the upper-limit value and not less than the lower-limit value (i.e., within the second permissible range), and specified object marks that have been displaced are shown by reference numerals in the field of exceptional marks. Also, FIG. 14 shows only part of all the assumable combinations. For instance, when the line segments L1, L2, L5 are specified as abnormal line segments, the object mark 91*a* is specified as the object mark that has been displaced from FIG. 14.

In cases where a plurality of FPCs 9 are arrayed generally in the reference array, or where the FPCs 9 having the object marks 91*a*-91*d*, even though having been deformed, rotated, warped or otherwise done, yet have been so done to some small extent, no object mark that has been displaced is specified (i.e., displaced object marks count zero) (step S26), and then a reference position is determined from the four object marks 91*a*-91*d* (step S27). In such a case where an FPC 9 has been partly warped as shown in FIGS. 11A and 11B, one displaced object mark is specified (step S28), and a reference position is determined from the remaining three object marks (step S29). Further, in such a case where one FPC 9 has been largely rotated or deformed or so done as shown in FIG. 10, two displaced object marks are specified (step S30), and a reference position is determined from the remaining two object marks (step S31).

Various methods are applicable as the method for determining the reference position from a plurality of object marks as shown above. For example, when a reference position is determined from two object marks, a position distant by a specified distance in a specified direction from a point by which a line segment interconnecting the two object marks is equally two divided is determined as the reference position. More specifically, when the two object marks are the object marks 91*a*, 91*b*, a point which is distant from a middle point of a line segment interconnecting the two object marks, by a design distance determined from the reference array and in a direction which is vertical to the line segment and which is directed toward the center of the conveyance tray 8 is determined as the reference position. Further, along with the determination of the reference position, a comparison is made between the line segment interconnecting the two object marks and a line segment in the reference array corresponding to the line segment so that an angular displacement amount in the X-Y plane is calculated, and the calculated angular displacement amount is stored and retained in association with the reference position, lending itself to use in later alignment.

In a case where the reference position is determined from, for example, three or more object marks, the reference position can be determined by a method that two object marks located more distant from one another are selected out of those object marks and the reference position is determined from the two object marks.

Otherwise, it is also possible to determine a centroid (a center of gravity) from three or more object marks and determine the centroid as the reference position instead of such cases as described above. For example, in a case where a reference position is determined from four object marks 91*a*, 91*b*, 91*c*, 91*d* shown in FIG. 9, a centroid P1 of those object marks may be determined as the reference position. In short, it is necessary only that a reference center determined from a plurality of object marks can be determined as a reference position, and the case where a centroid is used as the reference center may be replaced with another where, for example, a circumcenter is used as the reference center.

Once the reference position has been determined as shown above, steps following step S15 in the flowchart of FIG. 5 are executed in succession. Since the reference position is determined by such a method as shown above, it becomes possible to properly print the patterns 82 of solder paste onto the FPCs 9 having at least no occurrence of rotation or deformation or the like. In particular, in the printing process, by the screen 41 being placed on top of the individual FPCs 9, floats or warps that have occurred to the FPCs 9 are corrected by the pressing by the screen 41, so that the printing can be carried out properly.

Meanwhile, in a case where three or more object marks are specified as those which have been displaced, i.e., where not more than one object mark has been decided as not having been displaced (step S30), it is decided that determining a reference position from object marks is impossible, followed by a stop of the printing process on the FPCs 9 (step S32). Such a decision result is sent to the operator for notification. The operator, given such a notification, may take measures of repositioning the improperly held FPCs 9 on the conveyance tray 8, followed by a return to step S21, or peeling off all the FPCs 9 from the conveyance tray 8, followed by a skip of the process with this tray 8 and a return to step S11.

In the reference position determining process as described above, lengths of a plurality of line segments interconnecting two object marks among three or more object marks are compared with their corresponding (second) threshold values, respectively. As a result of this, an object mark or object marks that have been displaced can be specified easily and correctly, so that the reference position for the execution of printing related to the mounting of electronic components onto the FPCs 9 can be determined with high precision. It is noted that object marks that have been displaced do not necessarily need to be specified by looking up such a table as shown in FIG. 14 with the use of a comparison result between the lengths of line segments and threshold values, but object marks that have been displaced may be specified, for example, by a specified calculational method from a comparison result between the lengths of line segments and threshold values. Also, although the foregoing description has been made on a process for specifying displaced object marks by using six line segments that interconnect four object marks, respectively, yet all the line segments do not necessarily need to be used only if the displaced object marks can be specified. For example, with respect to four object marks, the displaced object marks can also be specified by using four line segments constituting a quadrilateral from those four object marks and one diagonal line.

Such a specifying method for displaced object marks (step S25) is not limited to the above-described or like cases. Here is explained another example as a method for specifying displaced object marks.

First, if it is decided at step S23 of FIG. 8 that all the line segments L1-L6 are within the first permissible range (i.e., it is decided that the printing process for the FPCs 9 is executed), a centroid P1 of the positions of the four object marks 91*a*-91*d* is determined and prepared by calculation as shown in FIG. 9. Then, distances between the centroid P1 and the individual four object marks 91*a*-91*d* are determined, and compared with an upper-limit value and a lower-limit value (i.e., the second permissible range), which are predetermined corresponding threshold values, thereby being confirmed whether to be within the second permissible range.

It is noted here that the upper-limit value and the lower-limit value in the second permissible range are determined by referencing distances between the centroid of the positions of the object marks in the reference array and the individual object marks. Then, object marks that have been determined to have a distance falling outside the permissible range out of the four object marks 91*a*-91*d* are specified as displaced object marks (step S25). In the example shown in FIG. 9, since the object marks 91*a*-91*d* are positioned at vertices of a rectangle, the distances between the centroid P1 and the individual four object marks are equal to one another, so that displacements of the object marks 91*a*-91*d* can be detected properly (i.e., with equal-level accuracy) by using the same upper-limit value and lower-limit value.

In the above-described method, when any of the object marks is displaced, the centroid P1 determined from the positions of those object marks is also displaced. However, since it is ensured by steps S22 and S23 that all the object marks are present generally at specified positions (i.e., satisfy the condition of being within the first permissible range), determining the distances between the centroid P1 and the individual object marks 91*a*-91*d* makes it possible to concretely specify displacements of the object marks simply and with high precision. Besides, the use of the centroid P1 makes it possible to grasp not only displaced object marks but also the types of deformation of the FPCs 9 (so called deformation mode) at the same time, so that more information can be offered to the operator. In particular, in such a method using the centroid, since displaced object marks can be specified more simply, there is an advantage that a calculation load in the control device 5 involved in the processing can be reduced. Particularly when a plurality of displaced object marks are less likely to be present, such a method using the centroid, by which the calculation load can be reduced, is effective. Conversely, when it is desired to securely specify displaced marks with higher precision, a method using the lengths of line segments as described above is effective. Further, in the method using the centroid as shown above, the centroid is used as an example of the reference center of the individual object marks, and therefore other reference centers, such as a circumcenter depending on the number of object marks or the like, may be used instead of using the centroid.

Moreover, in addition to such other examples as shown above, there are methods for specifying displaced object marks. For example, it is conceivable that, instead of cases where line segments interconnecting a plurality of object marks respectively are used, an angle formed by one set of two line segments is determined and then the resulting angle is compared with one in the reference array. However, in a case where the comparison and decision as described above is made by using angular data alone, it is desirable to combine the lengths of line segments with the angular data for implementation of the comparison in order to eliminate the possibility that similar figures are judged as identical figures. For example, in a case where four object marks are used, it is also possible that lengths of four line segments and an angle formed by one set of line segments are determined, or lengths of three line segments and angles formed by two sets of line segments are determined, and then the results are compared with those of a reference array. That is, any method may be used on condition that, in the displaced mark specifying section 52, relative positional relations among three or more object marks on a plurality of FPCs 9 held on the conveyance tray 8 are determined, and compared with a predetermined reference positional relation to allow displaced object marks to be specified. Similarly, at step S23 of FIG. 8, it is also possible that, by a method other than that using lengths of line segments interconnecting object marks to one another, relative positional relations among three or more object marks are determined, and compared with a predetermined reference positional relation to thereby decide whether or not subsequent steps are executed.

Then, a reference position for a plurality of FPCs 9 is determined based on two or more object marks resulting from excluding a displaced object mark or marks from three or more object marks. As a result of this, a displaced object mark or marks can be easily specified, and a reference position for execution of printing process, which is one of processes related to the mounting of electronic components onto the FPCs 9, can be determined with high precision while influences of deformation, rotation, warp or the like of the FPCs 9 are reduced. As a consequence, positional alignment between the screen 41 and the FPCs 9 is achieved based on the determined reference position, so that the solder paste 81 can be printed at specified positions on the FPCs 9 with high precision. Thus, the quality of the FPCs 9 (circuit boards) after the electronic component mounting can be improved.

Further, in the printing apparatus 1, before the processing in the printing device 4, lengths of a plurality of line segments obtained by interconnecting two object marks out of three or more object marks are compared with corresponding lengths in the reference array, and it is decided based on the comparison result whether or not the succeeding process in the printing device 4 on the plurality of FPCs 9 is executed. As a result of this, not only vain execution of printing related to the mounting of electronic components can be prevented, but also vain execution of the no-longer-unnecessary reference position determining process to its end can be eliminated. In addition, also for such processing, the case may be that a reference center which can be assumed from four object marks in the reference array, for example, a centroid (i.e., a design centroid of four object marks) is prepared, followed by making a decision through comparison using distances between the centroid and individual actual object marks as to whether or not succeeding process in the printing device 4 is executed.

Figure 12:
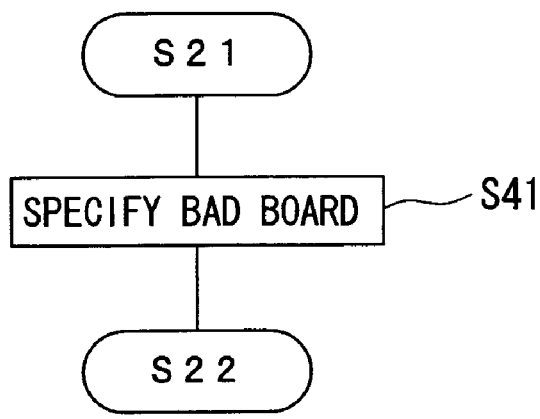
FIG. 12 is a flowchart showing part of the flow of reference position determining process in which a step of specifying bad boards is additionally included.

FIG. 12 is a view showing yet another example of the process for determining the reference position, showing a step additionally included between step S21 and step S22 of FIG. 8. In still another example of the reference position determining process, bad boards that have previously been excluded from the objects of electronic component mounting, such as FPCs 9 in which a formed pattern has been largely displaced or FPCs 9 in which the pattern has a defect, have a bad mark preparatorily given at a specified position to indicate the badness in the steps prior to printing. In the operation of acquiring the object mark on an FPC 9 (FIG. 8, step S21), the position of the bad mark on each FPC 9 (more precisely, the position of the bad mark which is present if the board is a bad board) is also included in image capture by the image pickup section 31, and FPCs 9 in which the bad mark is present are specified as bad boards in the control device 5 of the printing apparatus 1 (step S41). By such specification of bad boards in the printing apparatus 1, object marks on the bad boards are neglected in the processes to be executed from this on.

For example, in a case where one FPC out of three FPCs held on the conveyance tray 8 is specified as a bad board (i.e., the other two FPCs are not bad boards), the calculation of the lengths of line segments related to the object marks provided on the bad board is omitted at step S22 of FIG. 8, being excluded from decision objects in step S23. Also, it is not decided at step S25 as well whether or not the object marks on the bad board have been displaced. For example, with four object marks set in total for a plurality of FPCs 9 on the conveyance tray 8, if an FPC 9 having two object marks thereamong is a bad board, it is determined whether or not the remaining two object marks have been displaced. Then, if neither of the two object marks has been displaced (step S30), a reference position is determined from the two object marks (step S31). If any one of the object marks has been displaced (step S30), the printing process on the individual FPCs 9 is stopped (step S32). Then, replacement of FPCs 9 is performed as required as already described, or all the FPCs 9 are peeled off, followed by a return to step S11.

As described above, in the example in which the step of FIG. 12 is added to the steps of FIG. 8, bad boards are specified by picking up an image of a specified position of each FPC 9 on the conveyance tray 8, and only object marks provided on FPCs 9 other than bad boards out of the plurality of FPCs 9 are treated as calculation objects for the displaced mark specifying section 52. As a result, it becomes possible to efficiently determine object marks to be used for the determination of the reference position.

In addition, the process of specifying bad boards in step S41 may also be executed in other stages if it is done before the process of specifying displaced object marks (step S25). For example, the process may be executed between the step S13 of FIG. 5 and step S21 of FIG. 8. In this case, the image pickup of the object marks on the bad boards may be omitted, allowing the time required for step S21 to be cut down. Further, bad boards previously excluded from the objects of electronic component mounting do not necessarily need to be specified by bad marks and, for example, bad boards may also be specified by information, which shows that it is a bad board, being inputted in association with the conveyance tray 8 from an upstream device to the control device 5.

Although an embodiment of the present invention has been described above, the present invention is not limited to this embodiment and may be made in various modifications.

Figure 13:
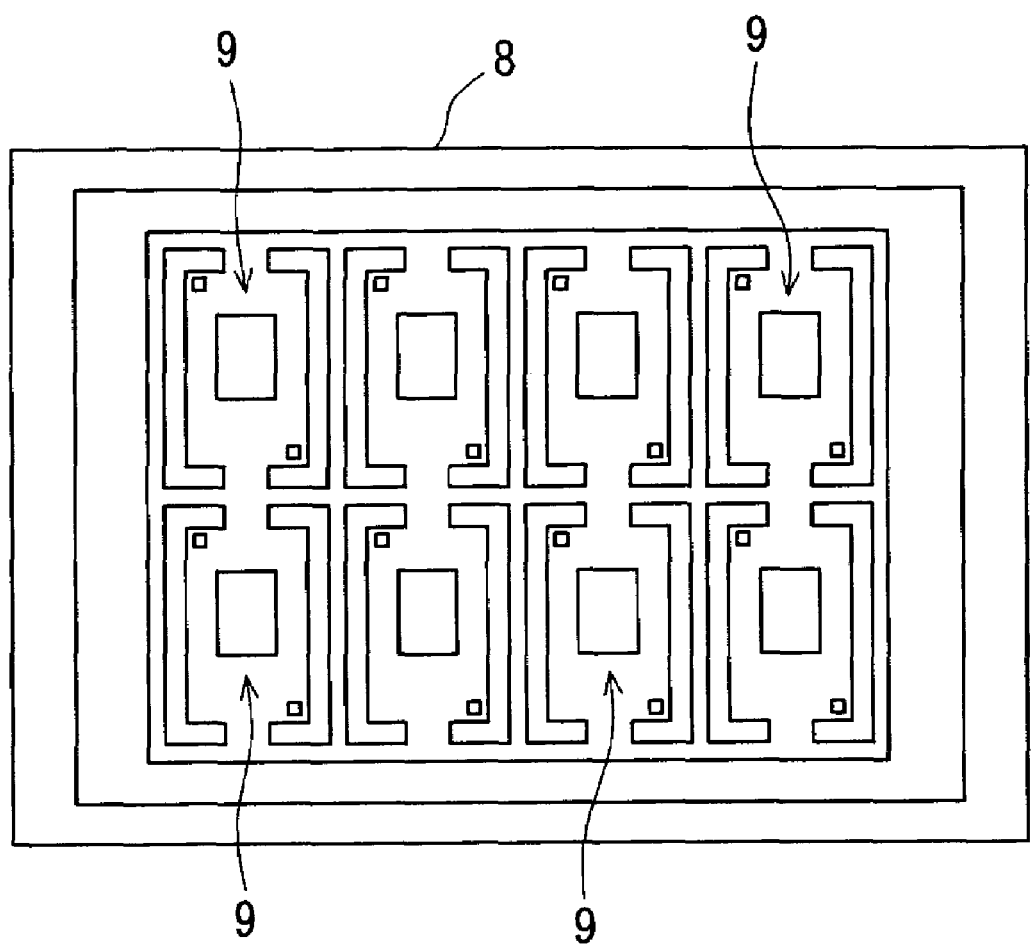
FIG. 13 is a view showing rigid boards placed on the conveyance tray.

The FPCs 9 held on the conveyance tray 8 do not need to be such independent FPCs 9 as shown in FIGS. 6, 7 and 10, and may be given as a sheet-like one in which a plurality of FPCs 9 are seriated as shown in FIG. 13. Also, the printing-object circuit board does not necessarily need to be an FPC and may be, for example, a rigid board in which interconnections are provided.

The printing apparatus 1 may be provided with a mechanism for moving the screen 41 in small steps in the X direction and the Y direction, allowing alignment between the screen 41 and the conveyance tray 8 to be fulfilled. Also, the printing apparatus 1 is applicable not only to the printing of solder paste but also to the printing of other electroconductive materials or other bonding materials for electronic component mounting such as adhesive agents dedicated to the fixation of electronic components and the like.

The member for holding the circuit board may be other than the conveyance tray 8 and, for example, one which holds only outer edge portions of circuit boards. Further, on the conveyance tray 8, a plurality of circuit boards are not necessary to be held and only one circuit board may be held.

In the above embodiment, the function as a reference position determining device for determining the reference position for a plurality of circuit boards held on the conveyance tray 8 is fulfilled by the image pickup section 31 as well as the mark position acquisition section 51, the displaced mark specifying section 52 and the reference position determining section 53 of the control device 5. Although this function can be said to be suitable particularly for collective printing process on a plurality of circuit boards, yet it is applicable also for other processing related to the mounting of electronic components onto circuit boards held on the conveyance tray 8, such as the mounting of flip chips of electronic components onto ceramic boards.

Furthermore, in the reference position determining process for the mounting of electronic components in FIG. 8, the process of determining whether or not the printing on a circuit board (FPC 9) is executed in steps S21 to S23 may be applied to other processes related to the mounting of electronic components.

Working Example

Now a working example with the use of concrete numerical values is described below with regard to the reference position determining process (the process shown the flowchart of FIG. 8) in the above embodiment. It is noted that this working example employs more emphasized numerical value examples on numerical values, permissible ranges and the like to be used for an easier understanding of this process.

Figure 15:
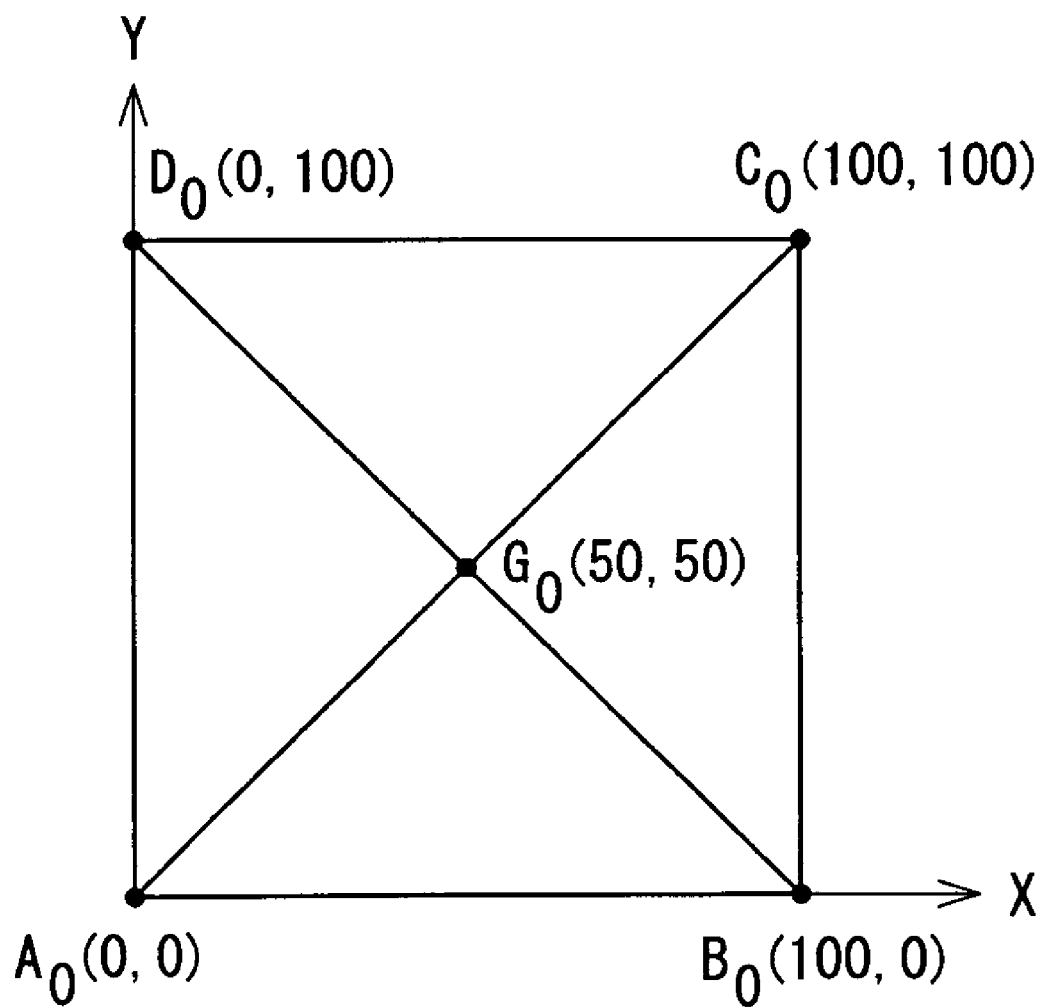
FIG. 15 is a schematic view for explaining a working example of the reference position determining process according to the embodiment, showing positional relations (reference data) among the individual object marks in a reference array of an FPC.
Figure 16:
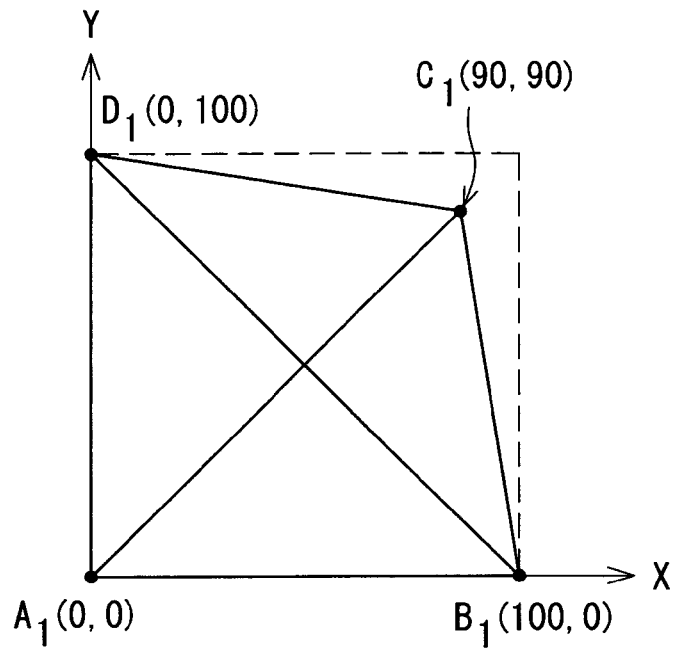
FIG. 16 is a schematic view showing positional relations among recognized and acquired individual object marks in the embodiment.

First, positional relations (reference data) of individual object marks in a reference array (i.e., on a design base) to be used in this working example is schematically shown in FIG. 15. As shown in FIG. 15, in this working example, a total of four object marks $A_0$, $B_0$, $C_0$ and $D_0$ are used, and the following lengths of line segments and a position of the centroid are set as reference data by using the individual object marks:

<Reference Data>
object mark $A_0=(0, 0)$
object mark $B_0=(100, 0)$
object mark $C_0=(100, 100)$
object mark $D_0=(0, 100)$
line segment $C_0D_0=100$
line segment $A_0D_0=100$
line segment $A_0B_0=100$
line segment $B_0C_0=100$
line segment $B_0D_0=141.4$
line segment $A_0C_0=141.4$
centroid $G_0=(50, 50)$ Next, positional relations of four object marks $A_1$, $B_1$, $C_1$ and $D_1$ in FPCs manufactured based on such reference data are shown in the schematic view of FIG. 16. These positional relations are acquired by the process of step S21, i.e., based on a picked-up image. It is noted that the object marks $A_0$, $B_0$, $C_0$ and $D_0$ as a reference array shown in FIG. 15 correspond to the object marks $A_1$, $B_1$, $C_1$ and $D_1$ as actual positions of FIG. 16.

As shown in FIG. 16, with respect to the object mark $C_1$ out of the four object marks, its actual position coordinates are (90, 90), bearing occurrence of a position coordinate displacement relative to the reference data. Such a displacement is caused by occurrence of floating or the like in the vicinity of the object mark $C_1$ in FPCs. Under such circumstances, a comparison process of steps S22 and S23 in FIG. 8 is executed by referencing a permissible range of line segment length of ±8% as a first permissible range. Result data 1 of the comparison process are as follows:

<Comparison Process Result Data 1>
line segment $C_1D_1=90.6$ (−9.4%)
→outside permissible range
line segment $A_1D_1=100$ (0%)
line segment $A_1B_1=100$ (0%) line segment $B_1C_1=90.6$ (−9.4%)
→outside permissible range
line segment $B_1D_1=141.4$ (0%)
line segment $A_1C_1=127.3$ (−10.0%)+
→outside permissible range As shown in the comparison process result data 1, since lengths of line segments $C_1D_1$, $B_1C_1$, $A_1C_1$ are over the first permissible range, the process, i.e., the printing process programmed to be subsequently executed on the FPCs is stopped or cancelled at step S24.

Figure 17:
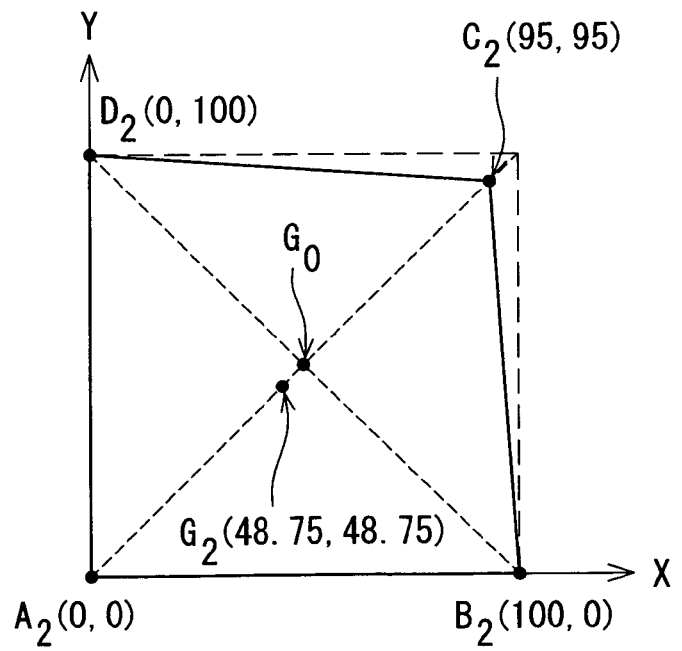
FIG. 17 is a schematic view showing another example of positional relations among recognized and acquired individual object marks in the embodiment.

Another example of the positional relations of individual object marks acquired for similar FPCs is shown in the schematic view of FIG. 17. It is noted that the object marks $A_0$, $B_0$, $C_0$ and $D_0$ as a reference array shown in FIG. 15 correspond to the object marks $A_2$, $B_2$, $C_2$ and $D_2$ as actual positions of FIG. 17.

As shown in FIG. 17, with respect to the object mark $C_2$ out of the four object marks, its actual position coordinates are (95, 95), having occurrence of a position coordinate displacement relative to the reference data. Under such circumstances, a comparison process of steps S22 and S23 in FIG. 8 is executed by referencing a permissible range of line segment length of ±8% as a first permissible range. Result data 2 of the comparison process are as follows:

<Comparison Process Result Data 2>
line segment $C_2D_2=95.1$ (−4.9%)
line segment $A_2D_2=100$ (0%)
line segment $A_2B_2=100$ (0%)
line segment $B_2C_2=95.1$ (−4.9%)
line segment $B_2D_2=141.4$ (0%)
line segment $A_2C_2=134.4$ (−5.0%)

As shown in the comparison result data 2, it is decided that lengths of all the line segments are within the first permissible range (step S23). If it is decided that the lengths are within the first permissible range like this, a process of specifying displaced object marks is subsequently executed at step S25. Although various methods as described before are applicable as the specifying method, yet the processing is explained by applying a specifying method using the centroid as an example.

More specifically, coordinates of a centroid $G_2$ are determined by using position coordinates of the four object marks $A_2$, $B_2$, $C_2$ and $D_2$, distances between the centroid $G_2$ and the individual object marks $A_2$, $B_2$, $C_2$ and $D_2$ are determined, and the distances are compared with reference data in the reference array of FIG. 15. The second permissible range is set to ±4% as a decision criterion in this comparison. Comparison process result data 3 are as follows:

<Comparison Process Result Data 3>
centroid $G_2=(48.75, 48.75)$
line segment $A_2G_2=68.94$ (−2.50%)
line segment $B_2G_2=70.73$ (+0.03%)
line segment $C_2G_2=65.40$ (−7.50%)
→outside permissible range
line segment $D_2G_2=70.73$ (+0.03%)

As shown in the comparison process result data 3, since the length of line segment $C_2G_2$ is over the second permissible range, the object mark $C_2$ is specified as a displaced object mark at step S25. Thereafter, it is decided at step S28 that displaced marks count one, and a reference position is calculated by using the remaining three marks, i.e. object marks $A_2$, $B_2$ and $D_2$.

For example, in a case where the object mark $C_2$ has been displaced by floating of the FPC, the floating posture of the FPC is corrected in the subsequent printing process with the screen placed on the bad-board FPC. However, in another case where the reference position is determined by using the object mark $C_2$, there occurs an error between the reference position of the FPC, the floating posture of which has been corrected, and the determined reference position, making it difficult to achieve high-precision positioning.

However, even in cases where the object mark $C_2$ has been displaced as shown above, high-precision positioning can be achieved reliably and conveniently by determining the reference position with the displaced object mark $C_2$ excluded and from the remaining object marks.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2004-240467 filed on Aug. 20, 2004 including specification, drawing and claims are incorporated herein by reference in its entirety.

INDUSTRIAL APPLICABILITY

The present invention is applicable to various types of processing related to electronic component mounting with the use of a reference position serving for positioning with respect to one or a plurality of circuit boards.

What is claimed is:

1. A reference position determining method for determining a reference position of a circuit board in execution of a process related to mounting of electronic components onto the circuit board, wherein the circuit board is a flexible circuit board or a circuit board held on a conveyor member in execution of the process, said method comprising:

acquiring respective positional data of at least three reference-position-determining marks which are provided on at least one circuit board to be integrally treated in the process;

determining relative positional relations between the at least three marks and comparing each of the relative positional relations with a corresponding predetermined reference positional relation to determine whether each of the relative positional relations is within a first permissible range;

specifying one of the at least three marks as a displaced mark when the relative positional relation of the one mark is outside a second permissible range and each of the relative positional relations is within the first permissible range;

determining the reference position for the at least one circuit board using positional data that excludes positional data of the displaced mark; and positioning the at least one circuit board based on the reference position after the reference position of the at least one circuit board has been determined, wherein said determining relative positional relations comprises determining lengths of line segments interconnecting the at least three marks as the relative positional relations for the at least three marks, and the lengths of the individual line segments are compared with predetermined threshold values of length corresponding to the line segments.

2. The reference position determining method in accordance with claim 1, wherein the at least one circuit board is a plurality of circuit boards, and further comprising:

designating a bad circuit board which is to be excluded from the plurality of circuit boards before said specifying operation, wherein in said specifying operation, only marks provided on circuit boards, other than the bad circuit board, among the plurality of circuit boards are treated as the at least three marks.

3. A reference position determining method for determining a reference position of a circuit board in execution of a process related to mounting of electronic components onto the circuit board, wherein the circuit board is a flexible circuit board or a circuit board held on a conveyor member in execution of the process said method comprising:

acquiring respective positional data of at least three reference-position-determining marks which are provided on at least one circuit board to be integrally treated in the process;

determining relative positional relations between the at least three marks and comparing each of the relative positional relations with a corresponding predetermined reference positional relation to determine whether each of the relative positional relations is within a first permissible range;

specifying one of the at least three marks as a displaced mark when the relative positional relation of the one mark is outside a second permissible range and each of the relative positional relations is within the first permissible range;

determining the reference position for the at least one circuit board using positional data that excludes positional data of the displaced mark; and positioning the at least one circuit board based on the reference position after the reference position of the at least one circuit board has been determined, wherein said determining relative positional relations comprises determining lengths of line segments interconnecting the at least three marks as the relative positional relations for the at least three marks, and the lengths of the individual line segments are compared with predetermined threshold values of length corresponding to the line segments, and wherein the second permissible range is different from the first permissible range.

* * * * *

UNITED STATES PATENT AND TRADEMARK OFFICE
CERTIFICATE OF CORRECTION

| | |
|---|---|
| PATENT NO. | : 7,657,997 B2 |
| APPLICATION NO. | : 11/201134 |
| DATED | : February 9, 2010 |
| INVENTOR(S) | : Kentaro Nishiwaki et al. |

It is certified that error appears in the above-identified patent and that said Letters Patent is hereby corrected as shown below:

In the Claims

In column 20, claim 3, line 19, "the process said method comprising:" should read --the process, said method comprising:--.

Signed and Sealed this

Seventh Day of September, 2010

David J. Kappos
*Director of the United States Patent and Trademark Office*